US011621556B2

(12) United States Patent
Sakai et al.

(10) Patent No.: US 11,621,556 B2
(45) Date of Patent: Apr. 4, 2023

(54) PROTECTIVE CIRCUIT (71) Applicants: KABUSHIKI KAISHA TOSHIBA, Tokyo (JP); TOSHIBA ELECTRONIC DEVICES & STORAGE CORPORATION, Tokyo (JP)

(72) Inventors: Munenori Sakai, Kawasaki Kanagawa (JP); Shinji Fujii, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/458,146

(22) Filed: Aug. 26, 2021

(65) Prior Publication Data
US 2022/0320856 A1 Oct. 6, 2022

(30) Foreign Application Priority Data

Mar. 30, 2021 (JP) ............................. JP2021-057050

(51) Int. Cl.
*H02H 9/04* (2006.01)
*H01L 27/02* (2006.01)
(52) U.S. Cl.
CPC ......... *H02H 9/046* (2013.01); *H01L 27/0285* (2013.01)
(58) Field of Classification Search
CPC ........................ H02H 9/046; H01L 27/0285
USPC ........................................................ 361/56
See application file for complete search history.

(56) References Cited

U.S. PATENT DOCUMENTS 9,647,647 B2    5/2017  Narita
9,825,022 B2 *  11/2017 Chen .................... H01L 27/0266
9,985,433 B2    5/2018  Takada
(Continued)

FOREIGN PATENT DOCUMENTS

CN    101944530 A  *  1/2011
CN    112448378 A  *  3/2021
JP    2015103689 A  *  6/2015
(Continued)

OTHER PUBLICATIONS

Machine Translation of Fan Chinese Patent Document CN 101944530 A Jan. 2011 (Year: 2011).*
(Continued)

*Primary Examiner* — Kevin J Comber
(74) *Attorney, Agent, or Firm* — Kim & Stewart LLP (57) ABSTRACT A protective circuit includes a first line, a second line, and a signal line. A first and second diode are connected in series between the first and second lines. A resistor and a capacitor are connected between the first and second lines. A first inverter, a second inverter, a third inverter are connected in series between a node between the resistor and capacitor and a gate of a first transistor. A third diode is connected between the first and second lines. The first transistor is connected between the first and second lines. A second transistor is connected between the first line and a protected circuit. A gate of the second transistor is connected to the output of the first inverter. A third transistor is connected between the second line and the protected circuit. A gate of the third transistor is connected to output of the second inverter.

20 Claims, 4 Drawing Sheets (56) References Cited

U.S. PATENT DOCUMENTS

2005/0174707 A1* 8/2005 Ker .................... H01L 27/0292
                                                              361/56
2013/0093508 A1* 4/2013 Sakamoto ........... H01L 27/0262
                                                              327/566

FOREIGN PATENT DOCUMENTS

| JP | 2015103689 A | 6/2015 |
| JP | 2015173214 A | 10/2015 |
| JP | 2017037949 A | 2/2017 |

OTHER PUBLICATIONS

Machine Translation of Furukawa et al. Japanese Patent Document JP 2015103689 A Jun. 2015 (Year: 2015).*
Machine Translation of Xu Chinese Patent Document CN 112448378 A Mar. 2021 (Year: 2021).*

* cited by examiner

| STATE | WHEN VOLTAGE BY ESD IS APPLED | DURING NORMAL OPERATION |
|---|---|---|
| LOGICAL STATE OF INPUT END OF FIRST INVERTER 41 | L | H |
| LOGICAL STATE OF OUTPUT END OF SECOND INVERTER 42 | L | H |
| LOGICAL STATE OF OUTPUT END OF THIRD INVERTER 43 | H | L |
| STATE OF FIRST TRANSISTOR 51 | ON | OFF |
| STATE OF FIFTH TRANSISTOR 55 | OFF | ON |

FIG. 4

PROTECTIVE CIRCUIT

CROSS-REFERENCE TO RELATED APPLICATION

This application is based upon and claims the benefit of priority from Japanese Patent Application No. 2021-057050, filed Mar. 30, 2021, the entire contents of which are incorporated herein by reference.

FIELD

Embodiments described herein relate generally to a protective circuit for electronic devices and circuits.

BACKGROUND

An electronic circuit can be provided with a protective circuit to protect the electronic circuit from electrostatic discharge (ESD).

An ESD protective circuit is used to improve ESD protection of the electronic circuit.

DETAILED DESCRIPTION

In general, according to one embodiment, an electrostatic discharge (ESD) tolerant circuit comprises a first line for supplying power to a protected circuit, a second line for supplying power to the protected circuit, and a signal line for supplying a signal to the protected circuit. A first diode has a cathode connected to the first line and an anode connected to the signal line. A second diode has a cathode connected to the signal line and an anode connected to the second line. A first resistor and a first capacitor are connected in series between the first line and the second line and in parallel with the first and second diodes between the first and second lines. A first inverter has an input side connected to a node between the first resistor and the first capacitor. A second inverter has an input side connected to an output side of the first inverter. A third inverter has an input side connected to an output side of the second inverter. A first transistor of a first type is connected between the first line and the second line in parallel with the series-connected first resistor and first capacitor. A gate of the first transistor is connected to the output side of the third inverter. A third diode is connected between the first line and the second line in parallel with the first transistor. A cathode of the third diode is connected to the first line and an anode of the third diode is connected to the second line. A second transistor of a second type is connected between the first line and the protected circuit. A gate of the second transistor is connected to a node between the first and second inverters. A third transistor of the first type is connected between the second line and the protected circuit. A gate of the second transistor is connected to a node between the second and third inverters.

Hereinafter, certain non-limiting example embodiments of the present disclosure will be described with reference to the drawings. In the description, parts which are the same or substantially the same are given the same reference symbol in each of the drawings. In general, the drawings are schematic and thus depicted dimensions, dimensional ratios between different aspects in the same drawing, and between different drawings are not necessarily reflective of actual implementations of the disclosed embodiments and the drawings are not intended as limiting with respect to other possible examples and/or implementations.

First Embodiment (Structure of Protective Circuit 100)

Figure 1:
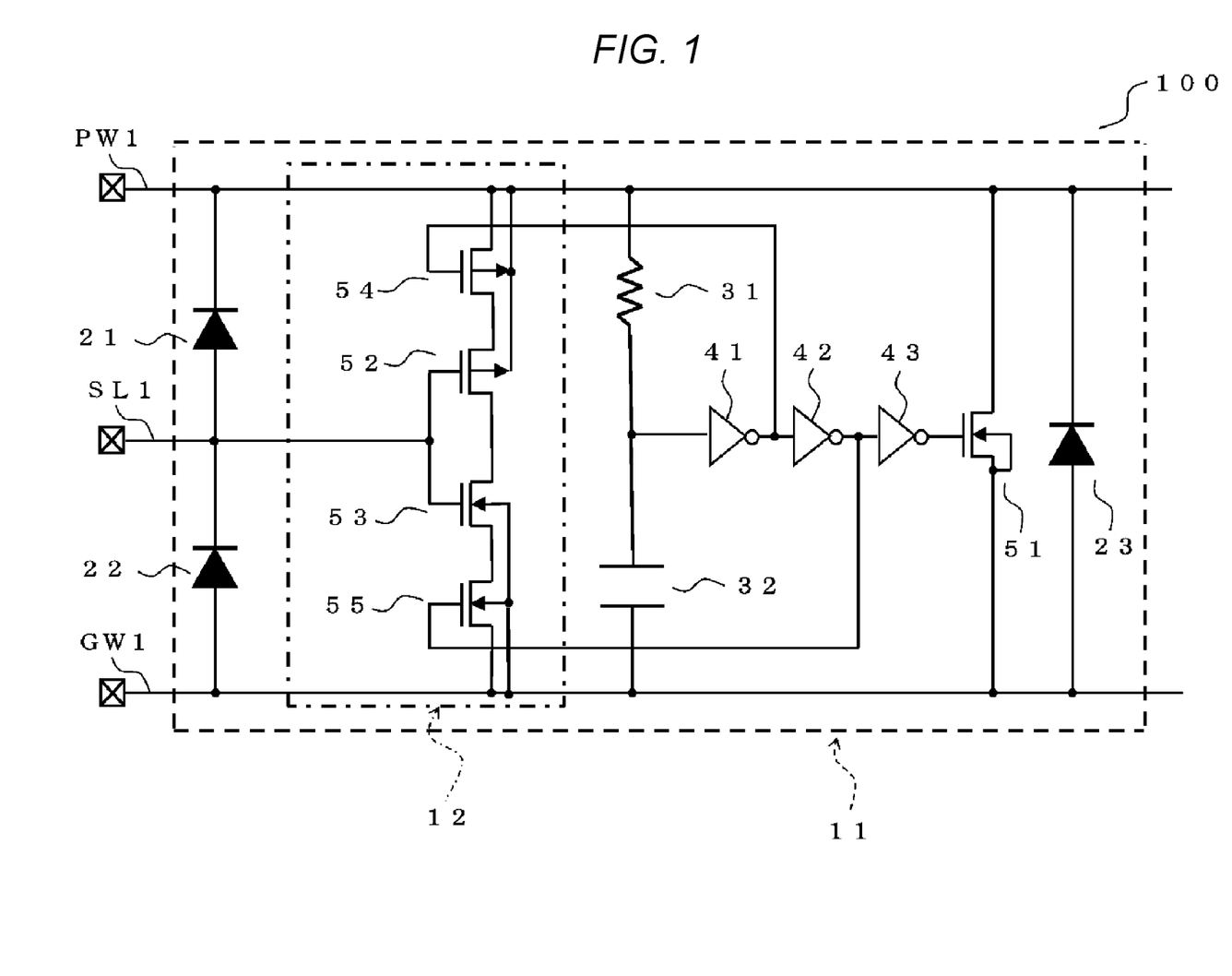
FIG. 1 is a circuit diagram illustrating an example of a protective circuit according to a first embodiment.

A protective circuit 100 according to a first embodiment will be described with reference to FIG. 1. FIG. 1 is a circuit diagram illustrating an example of a circuit configuration of the protective circuit 100 according to the first embodiment.

The protective circuit 100 includes a first power supply line PW1, a signal line SL1, a second power supply line GW1, a protective circuit 11, and a circuit to be protected 12 (protected circuit 12).

The first power supply line PW1 is connected to a first power supply terminal, and a first power supply voltage (Vdd) is applied thereto. The signal line SL1 is connected to a signal input terminal. The second power supply line GW1 is connected to a second power supply terminal, and a second power supply voltage (Vss) is applied thereto. The first power supply voltage Vdd is, for example, 5V. The second power supply voltage Vss is a voltage lower than the first power supply voltage Vdd. In this embodiment, the second power supply voltage Vss will be described as a ground voltage (GND).

The protective circuit 11 includes a first diode 21, a second diode 22, a resistance element 31, a capacitive element 32, a first inverter 41, a second inverter 42, a third inverter 43, a first transistor 51, and a third diode 23.

A cathode side of the first diode 21 is connected to the first power supply line PW1, and an anode side is connected to the signal line SL1. A cathode side of the second diode 22 is connected to the signal line SL1 and an anode side is connected to the second power supply line GW1. In some examples, instead of the first diode 21 and the second diode 22, a diode-connected MOS transistor may be provided to provide a similar function.

One end of the resistance element 31 is connected to the first power supply line PW1. The capacitive element 32 is connected between the other end of the resistance element 31 and the second power supply line GW1. That is, the resistance element 31 and the capacitive element 32 are connected in series between the first power supply line PW1 and the second power supply line GW1. The resistance value of the resistance element 31 is "R1," and the capacitance of the capacitive element 32 is "C2."

An input terminal of the first inverter 41 is connected to a node between the resistance element 31 and the capacitive element 32. An input terminal of the second inverter 42 is connected to an output terminal of the first inverter 41. An input terminal of the third inverter 43 is connected to an output terminal of the second inverter 42. An output terminal of the third inverter 43 is connected to a gate of the first transistor 51. That is, the first inverter 41 to the third inverter 43 are connected in series from the node between the resistance element 31 and the capacitive element 32 to the gate of the first transistor 51.

The gate of the first transistor 51 is connected to the output terminal of the third inverter 43, a drain of first transistor 51 is connected to the first power supply line PW1, and a source of first transistor 51 is connected to the second power supply line GW1. The first transistor 51 is, for example, an n-channel MOS transistor.

In FIG. 1, a single first transistor 51 is depicted between the first power supply line PW1 and the second power supply line GW1, but in other examples a plurality of transistors 51 with gates connected to the output terminal of the third inverter 43, drains connected to the first power supply line PW1, and sources connected to the second power supply line GW1 may be utilized in parallel. That is, for some examples, the single depicted first transistor 51 represents a plurality of transistors connected in the corresponding manner.

A cathode side of the third diode 23 is connected to the first power supply line PW1, and an anode side thereof is connected to the second power supply line GW1.

The protected circuit 12 includes a second transistor 52, a third transistor 53, a fourth transistor 54, and a fifth transistor 55.

A gate of the second transistor 52 is connected to the signal line SL1. A body of the second transistor 52 is connected to the first power supply line PW1. A gate of the third transistor 53 is connected to the signal line SL1. A drain of the third transistor 53 is connected to a drain of the second transistor 52. A body of the third transistor 53 is connected to the second power supply line GW1. A gate of the fourth transistor 54 is connected to a node that is between the output terminal of the first inverter 41 and the input terminal of the second inverter 42. A source and a body of the fourth transistor 54 are connected to the first power supply line PW1. A drain of the fourth transistor is connected to a source of the second transistor 52. A gate of the fifth transistor 55 is connected between to a node that is between the output terminal of the second inverter 42 and the input terminal of the third inverter 43. A source and a body of the fifth transistor 55 are connected to the second power supply line GW1. A drain of the fifth transistor 55 is connected to a source of the third transistor 53. The second transistor 52 and the fourth transistor 54 are, for example, p-channel MOS transistors. The first transistor 51, the third transistor 53, and the fifth transistor 55 are, for example, n-channel MOS transistors.

Figure 2:
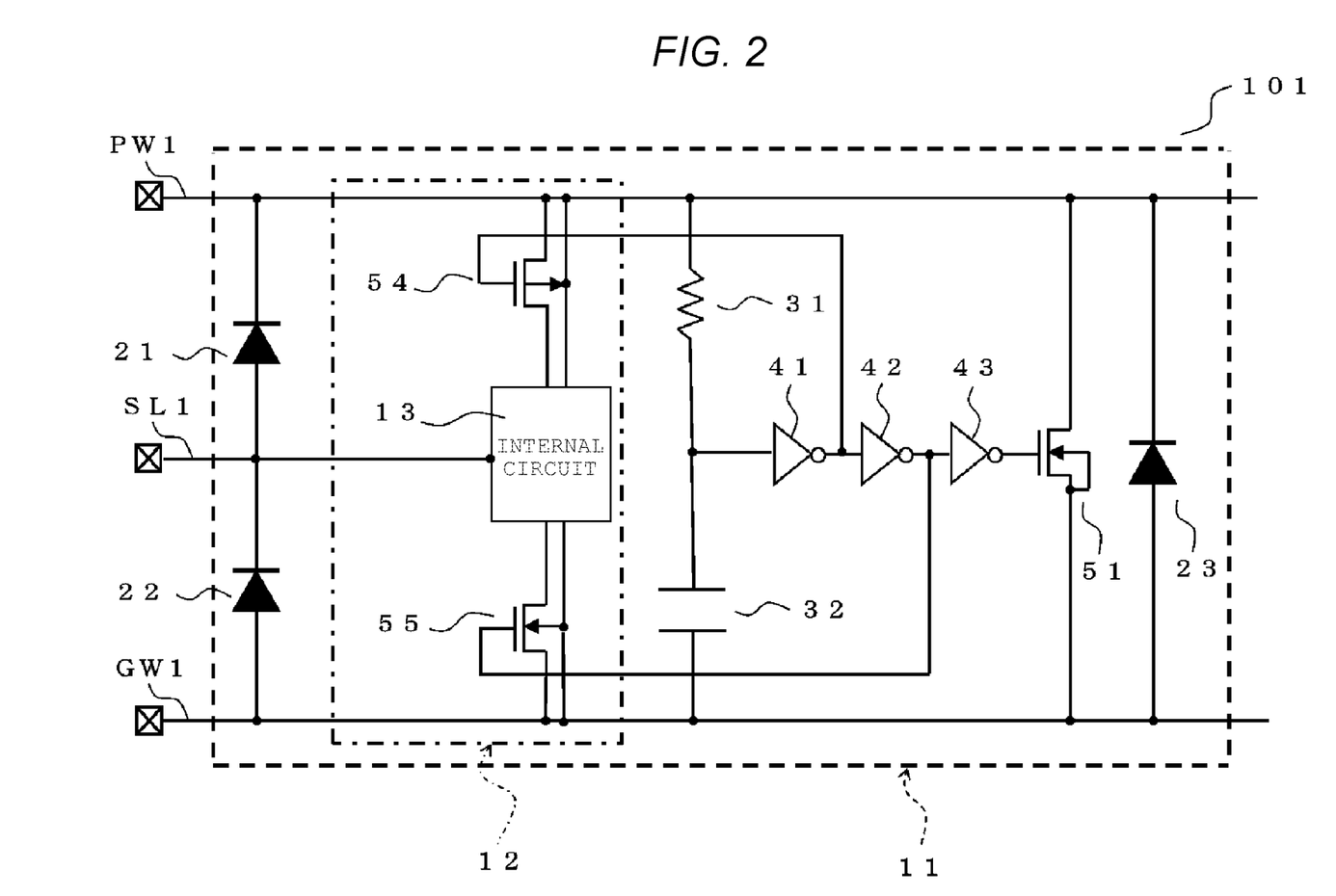
FIG. 2 is a circuit diagram illustrating an example of a protective circuit according to a modification of the first embodiment.

The present embodiment shows that the second transistor 52 and the third transistor 53 of the protected circuit 12 form an inverter, but as illustrated in FIG. 2, any other logical circuit may be formed in a portion labeled as internal circuit 13.

(Operation of Protective Circuit 100)

Figure 3:
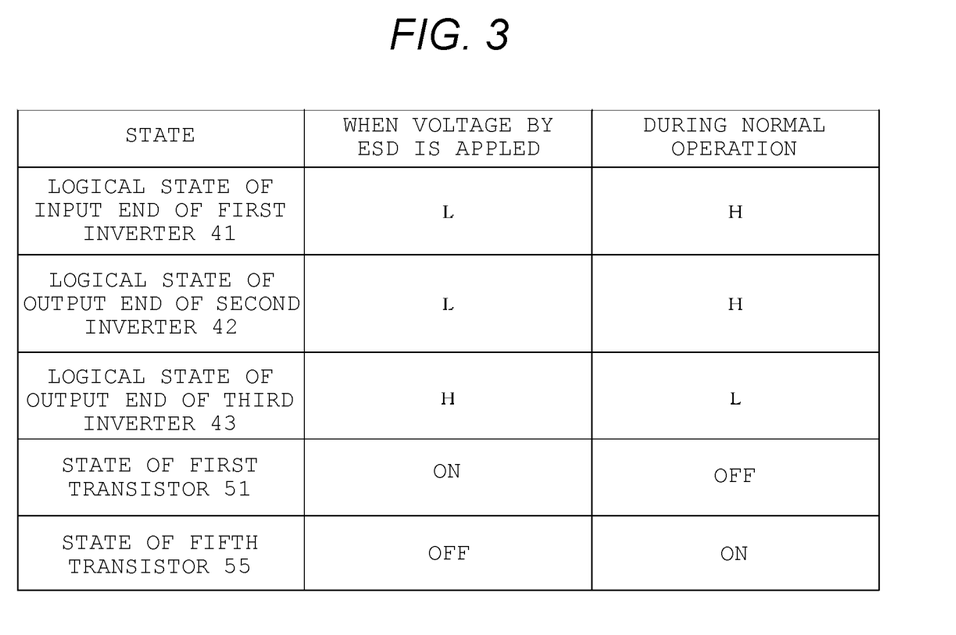
FIG. 3 is a table illustrating aspects related to an operation of a protective circuit according to a first embodiment.

An operation of the protective circuit 100 according to the first embodiment will be described with reference to FIG. 3. FIG. 3 is a table illustrating various possible states of operation for the protective circuit 100 according to the first embodiment.

When a positive ESD voltage is received on the signal line SL1 from the signal input terminal, a surge current passes through the first diode 21 and reaches the first power supply line PW1. The charge amount of the first power supply line PW1 increases, such that the voltage of the first power supply line PW1 rises. Here, the values of R1 (resistance value of the resistance element 31) and C2 (capacitance value of the capacitive element 32) are set by design so that product R1×C2 (a RC time constant) will be a time value sufficiently longer than time of an instantaneous surge current inflow generated by the ESD. Within the time period corresponding to the RC time constant, the voltage between the resistance element 31 and the capacitive element 32 will become lower than the voltage of the first power supply line PW1. Therefore, a low (L) logic signal (an "L state") is input to the input terminal of the first inverter 41, and thus a high (H) logic signal (an "H state") is output from the first inverter 41 to the input terminal of the second inverter 42. The second inverter outputs the L state to the input terminal of the third inverter 43. The third inverter 43 outputs the H state. As a result, a positive voltage is applied to the gate of the first transistor 51, and the first transistor 51 thus goes into an ON state (conductive state). As a result, the surge current flows from the first power supply line PW1 then through the first transistor 51 to reach the second power supply line GW1. Thus, the surge current is discharged to the second power supply terminal via the second power supply line GW1.

Since an output of the second inverter 42 is in the L state, no voltage is applied to the gate of the fifth transistor 55, which is connected to the output end of the second inverter 42. Therefore, the fifth transistor 55 maintains an OFF state (non-conductive state) when the voltage by the ESD is received.

The voltage difference occurring between the signal line SL1 and the second power supply line GW1 caused by the ESD-induced surge current being input to the signal line SL1 is referred to as a clamp voltage in this context.

On the other hand, during normal operation during which the ESD voltage is not received at the signal line SL1, the first power supply voltage Vdd maintains a constant value. Therefore, electric charges are stored in the capacitive element 32, and the voltage between the resistance element 31 and the capacitive element 32 becomes higher than the voltage of the first power supply line PW1. The H state is input to the input terminal of the first inverter 41, and the L state is output. The L state is input to the input terminal of the second inverter 42, and the H state is output. The H state is input to the input terminal of the third inverter 43, and the L state is output. As a result, no voltage is applied to the gate of the first transistor 51, and the first transistor 51 maintains the OFF state. Since the output end of the second inverter 42 is at the H state, a voltage is applied to the gate of the fifth transistor 55 connected to the output end of the second inverter 42. Therefore, the fifth transistor 55 maintains the ON state during the normal operation.

In the embodiment, the second power supply voltage Vss is lower than the first power supply voltage Vdd. However, when the second power supply voltage Vss is lower than the first power supply voltage Vdd, a current input from the second power supply terminal passes through the second power supply line GW1, the third diode 23, and the first power supply line PW1 in this order, and is discharged to the first power supply terminal.

When a signal is input to the signal line SL1 during the normal operation, the signal is transmitted to a circuit connected to a common drain formed by the second transistor 52 and the third transistor 53.

Effect of First Embodiment

Figure 4:
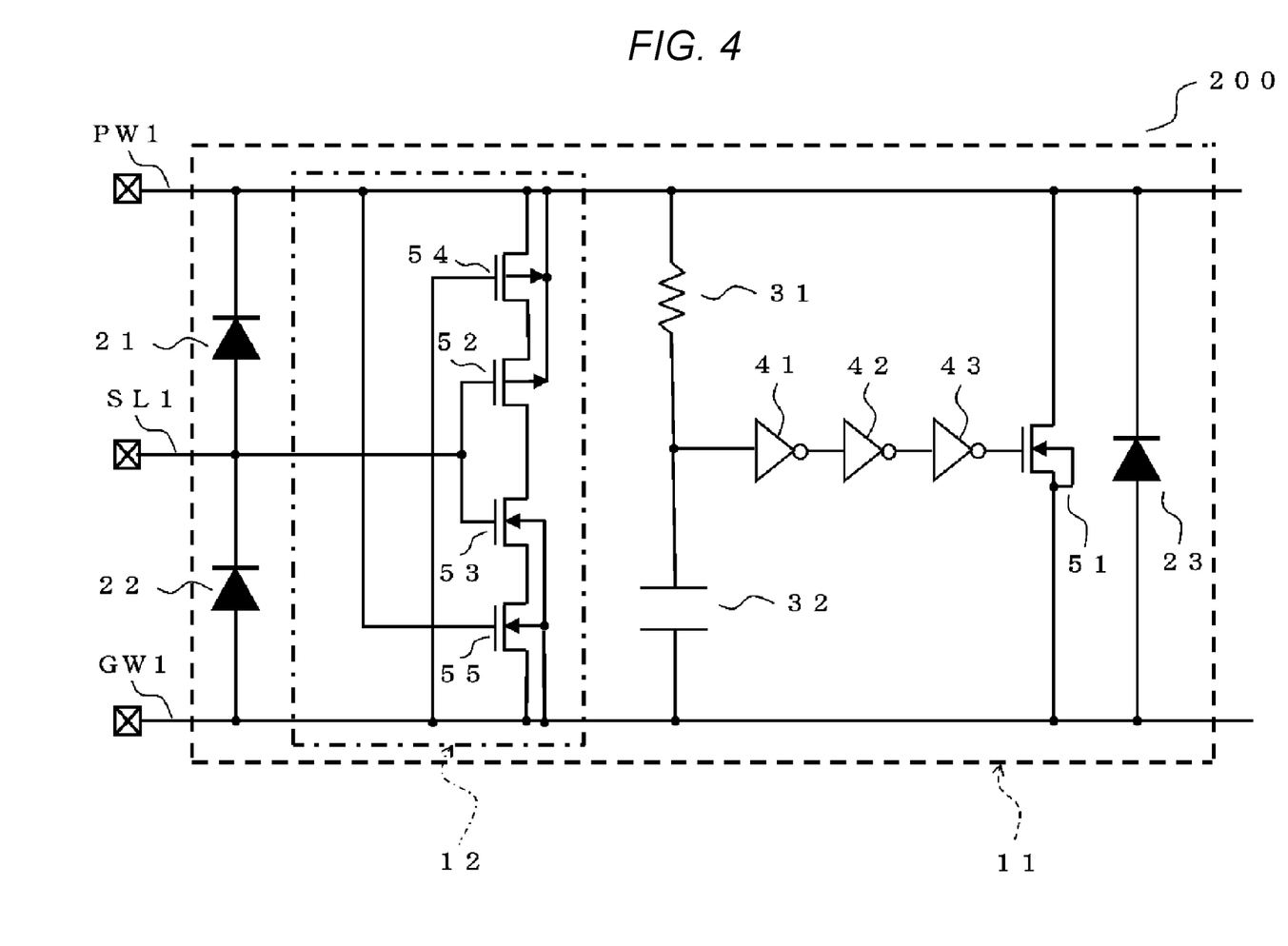
FIG. 4 is a circuit diagram illustrating a circuit configuration of a protective circuit according to a comparative example.

An effect of the protective circuit 100 according to the first embodiment will be described by using a protective circuit 200 according to a comparative example. FIG. 4 is a circuit diagram illustrating an example of a circuit configuration of the protective circuit 200 according to the comparative example. The same portion as that of the protective circuit 100 according to the first embodiment will be denoted by the same reference sign.

The protective circuit 200 according to the comparative example is different from the protective circuit 100 of the first embodiment in that the gate of the fourth transistor 54 is connected to the second power supply line GW1, and the gate of the fifth transistor 55 is connected to the first power supply line PW1.

When the positive ESD voltage is received by the signal line SL1, the clamp voltage rises. When the clamp voltage rises, a voltage is applied between the sources and the gates of the second transistor 52 and the third transistor 53. If the fifth transistor 55 was not provided in the manner of the first embodiment and the clamp voltage were to exceed the source-to-gate breakdown voltage of the second transistor 52 and the third transistor 53, the second transistor 52 and the third transistor 53 would be broken.

In the protective circuit 200 according to the comparative example, the fifth transistor 55 is connected in series with the second transistor 52 and the third transistor 53. As a result, the voltage applied between the sources and the gates of the second transistor 52 and the third transistor 53 is reduced by a value of a source-to-drain voltage of the fifth transistor 55. That is, a breakdown voltage of the third transistor 53 with respect to the clamp voltage is increased by the value of the source-to-drain voltage of the fifth transistor 55.

In the protective circuit 200 according to the comparative example, the fourth transistor 54 and the fifth transistor 55 go into the ON state when the signal is input to the signal line SL1 during the normal operation so the inverter formed by the second transistor 52 and the third transistor 53 can function. The gate of the fourth transistor 54 is connected to the second power supply line GW1 and the gate of the fifth transistor 55 is connected to the first power supply line PW1, such that the fifth transistor 55 goes into the ON state even when the positive ESD voltage is received by the signal line SL1.

However, since the source-to-drain breakdown voltage of the fifth transistor 55 is larger when the transistor goes into the OFF state than when the transistor goes into the ON state, the breakdown voltage of the third transistor 53 with respect to the clamp voltage rises. Thus, it is desirable that the fifth transistor 55 goes into the OFF state when the positive voltage by the ESD is applied to the signal line SL1.

On the other hand, in the protective circuit 100 according to the first embodiment, the gate of the fourth transistor 54 is connected between the first inverter 41 and the second inverter 42, and the gate of the fifth transistor 55 is connected between the second inverter 42 and the third inverter 43.

When a signal is input to the signal line SL1 during the normal time, the H state is output from the second inverter 42. Therefore, the voltage is applied to the gate of the fifth transistor 55, and the fifth transistor 55 goes into the ON state.

When the positive ESD voltage is applied to the signal line SL1, the L state is output from the second inverter 42. Therefore, no voltage is applied to the gate of the fifth transistor 55, and the fifth transistor 55 goes into the OFF state. In comparison with the protective circuit 200, the value of the source-to-drain voltage of the fifth transistor 55 in the present example becomes larger, such that the breakdown voltage of the transistor rises.

In comparison with the protective circuit 200, the value of the source-to-drain voltage of the fifth transistor 55 becomes larger such that the breakdown voltage of the transistor rises, thereby making it possible to reduce an upper limit of a current value per unit time flowing through the first diode 21. That is, the area necessarily occupied by the first diode 21 can be reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An ESD tolerant circuit, comprising:
   a first line for supplying power to a protected circuit;
   a second line for supplying power to the protected circuit;
   a signal line for supplying a signal to the protected circuit;
   a first diode having a cathode connected to the first line and an anode connected to the signal line;
   a second diode having a cathode connected to the signal line and an anode connected to the second line;
   a first resistor and a first capacitor connected in series between the first line and the second line and in parallel with the first and second diodes between the first and second lines;
   a first inverter having an input side connected to a node between the first resistor and the first capacitor;
   a second inverter having an input side connected to an output side of the first inverter;
   a third inverter having an input side connected to an output side of the second inverter;
   a first transistor of a first type that is connected between the first line and the second line in parallel with the series-connected first resistor and first capacitor, a gate of the first transistor connected to the output side of the third inverter;
   a third diode connected between the first line and the second line in parallel with the first transistor, a cathode of the third diode being connected to the first line and an anode of the third diode being connected to the second line;
   a second transistor of a second type that is connected between the first line and the protected circuit, a gate of the second transistor being connected to a node between the first and second inverters; and
   a third transistor of the first type that is connected between the second line and the protected circuit, a gate of the third transistor being connected to a node between the second and third inverters.

2. The ESD tolerant circuit according to claim 1, wherein the protected circuit is an inverter.

3. The ESD tolerant circuit according to claim 2, wherein the inverter comprises:
   a fourth transistor of the second type connected to the second transistor, and
   a fifth transistor of the first type connected between the fourth transistor and the third transistor, wherein
   gates of the fourth and fifth transistors are each connected to the signal line.

4. The ESD tolerant circuit according to claim 3, wherein the first type is an n-channel metal-oxide-semiconductor field effect transistor, and
the second type is a p-channel metal-oxide-semiconductor field effect transistor.

5. The ESD tolerant circuit according to claim 1, wherein the first type is an n-channel metal-oxide-semiconductor field effect transistor, and
the second type is a p-channel metal-oxide-semiconductor field effect transistor.

6. The ESD tolerant circuit according to claim 1, wherein the protected circuit is a logic circuit.

7. The ESD tolerant circuit according to claim 1, wherein the first transistor comprises a plurality of transistors connected in parallel between the first and second lines, each transistor of the plurality having a drain connected to the first line, a source connected to the second line, and a gate connected to the output side of the third inverter.

8. The ESD tolerant circuit according to claim 1, wherein the first diode and the second diode are each diode-connected MOS transistors.

9. The ESD tolerant circuit according to claim 1, wherein the time constant value of the series-connected first resistor and first capacitor is longer than an expected time period of an ESD inflow current.

10. A protective circuit, comprising:
a first power supply line connected to a first power terminal;
a second power supply line connected to a second power terminal;
a signal line connected to a signal input terminal;
a first diode having a cathode connected to the first power supply line and an anode connected to the signal line;
a second diode having a cathode connected to the signal line and an anode connected to the second power supply line;
a first resistor and a first capacitor connected in series between the first power supply line and the second power supply line and in parallel with the first and second diodes between the first and second power supply lines;
a first inverter having an input side connected to a node between the first resistor and the first capacitor;
a second inverter having an input side connected to an output side of the first inverter;
a third inverter having an input side connected to an output side of the second inverter;
a first transistor of a first type that is connected between the first power supply line and the second power supply line in parallel with the series-connected first resistor and first capacitor, a gate of the first transistor connected to the output side of the third inverter;
a third diode connected between the first power supply line and the second power supply line in parallel with the first transistor, a cathode of the third diode being connected to the first power supply line and an anode of the third diode being connected to the second power supply line;
a second transistor of a second type that is connected to the first power supply line, a gate of the second transistor being connected to a node between the first and second inverters;
a third transistor of the first type that is connected to the second power supply line, a gate of the third transistor being connected to a node between the second and third inverters; and
an internal circuit connected between the second and third transistors.

11. The protective circuit according to claim 10, wherein the internal circuit is an inverter.

12. The protective circuit according to claim 11, wherein the inverter comprises:
a fourth transistor of the second type connected to the second transistor, and
a fifth transistor of the first type connected between the fourth transistor and the third transistor, wherein
gates of the fourth and fifth transistors are each connected to the signal line.

13. The protective circuit according to claim 12, wherein the first type is an n-channel metal-oxide-semiconductor field effect transistor, and
the second type is a p-channel metal-oxide-semiconductor field effect transistor.

14. The protective circuit according to claim 10, wherein the first type is an n-channel metal-oxide-semiconductor field effect transistor, and
the second type is a p-channel metal-oxide-semiconductor field effect transistor.

15. The protective circuit according to claim 10, wherein the internal circuit is a logic circuit.

16. The protective circuit according to claim 10, wherein the first transistor comprises a plurality of transistors connected in parallel between the first and second power supply lines, each transistor of the plurality having a drain connected to the first power supply line, a source connected to the second power supply line, and a gate connected to the output side of the third inverter.

17. The protective circuit according to claim 10, wherein the first diode and the second diode are each diode-connected MOS transistors.

18. The protective circuit according to claim 10, wherein the time constant value of the series-connected first resistor and first capacitor is longer than an expected time period of an ESD inflow current.

19. An ESD tolerant circuit, comprising:
a first power supply line connected to a first power terminal;
a second power supply line connected to a second power terminal;
a signal line connected to a signal input terminal;
a first diode having a cathode connected to the first power supply line and an anode connected to the signal line;
a second diode having a cathode connected to the signal line and an anode connected to the second power supply line;
a first resistor and a first capacitor connected in series between the first power supply line and the second power supply line and in parallel with the first and second diodes between the first and second power supply lines;
a first inverter having an input side connected to a node between the first resistor and the first capacitor;
a second inverter having an input side connected to an output side of the first inverter;
a third inverter having an input side connected to an output side of the second inverter;
a first transistor of a first type that is connected between the first power supply line and the second power supply line in parallel with the series-connected first resistor and first capacitor, a gate of the first transistor connected to the output side of the third inverter;
a third diode connected between the first power supply line and the second power supply line in parallel with the first transistor, a cathode of the third diode being connected to the first power supply line and an anode of the third diode being connected to the second power supply line;

a second transistor of a second type that is connected to the first power supply line, a gate of the second transistor being connected to a node between the first and second inverters;

a third transistor of the first type that is connected to the second power supply line, a gate of the third transistor being connected to a node between the second and third inverters;

a fourth transistor of the second type connected to the second transistor; and a fifth transistor of the first type connected between the fourth transistor and the third transistor, wherein gates of the fourth and fifth transistors are each connected to the signal line.

20. The ESD tolerant circuit according to claim 19, wherein the first diode and the second diode are each diode-connected MOS transistors.

\* \* \* \* \*